United States Patent [19]
Komoriya et al.

[11] 4,253,163
[45] Feb. 24, 1981

[54] SENSE AMPLIFIER-DETECTOR CIRCUIT

[75] Inventors: Goh Komoriya, Allentown; Ernst H. Young, Jr., Center Valley, both of Pa.

[73] Assignee: Bell Telephone Laboratories, Incorporated, Murray Hill, N.J.

[21] Appl. No.: 82,582

[22] Filed: Oct. 9, 1979

[51] Int. Cl.³ ............................................. G11C 7/06
[52] U.S. Cl. ............................ 365/205; 307/DIG. 3; 365/207
[58] Field of Search ............................ 365/205, 207; 307/DIG. 3, 279

[56] References Cited
U.S. PATENT DOCUMENTS

| | | | |
|---|---|---|---|
| 3,983,412 | 9/1976 | Roberts et al. | 307/DIG. 3 |
| 4,039,861 | 8/1977 | Heller et al. | 307/DIG. 3 |
| 4,130,897 | 12/1978 | Horne et al. | 365/205 |

*Primary Examiner*—Stuart N. Hecker
*Attorney, Agent, or Firm*—Irwin Ostroff

[57] ABSTRACT

A latching type of sense amplifier, which uses depletion mode transistors as resistive load elements, a pair of enhancement mode field effect transistors as input devices, two other pairs of enhancement mode field effect transistors, and, in addition, a cross-coupled pair of enhancement mode field effect transistors, provides relatively high sensitivity and fast latching time essentially independent of input and output capacitive loading.

6 Claims, 1 Drawing Figure

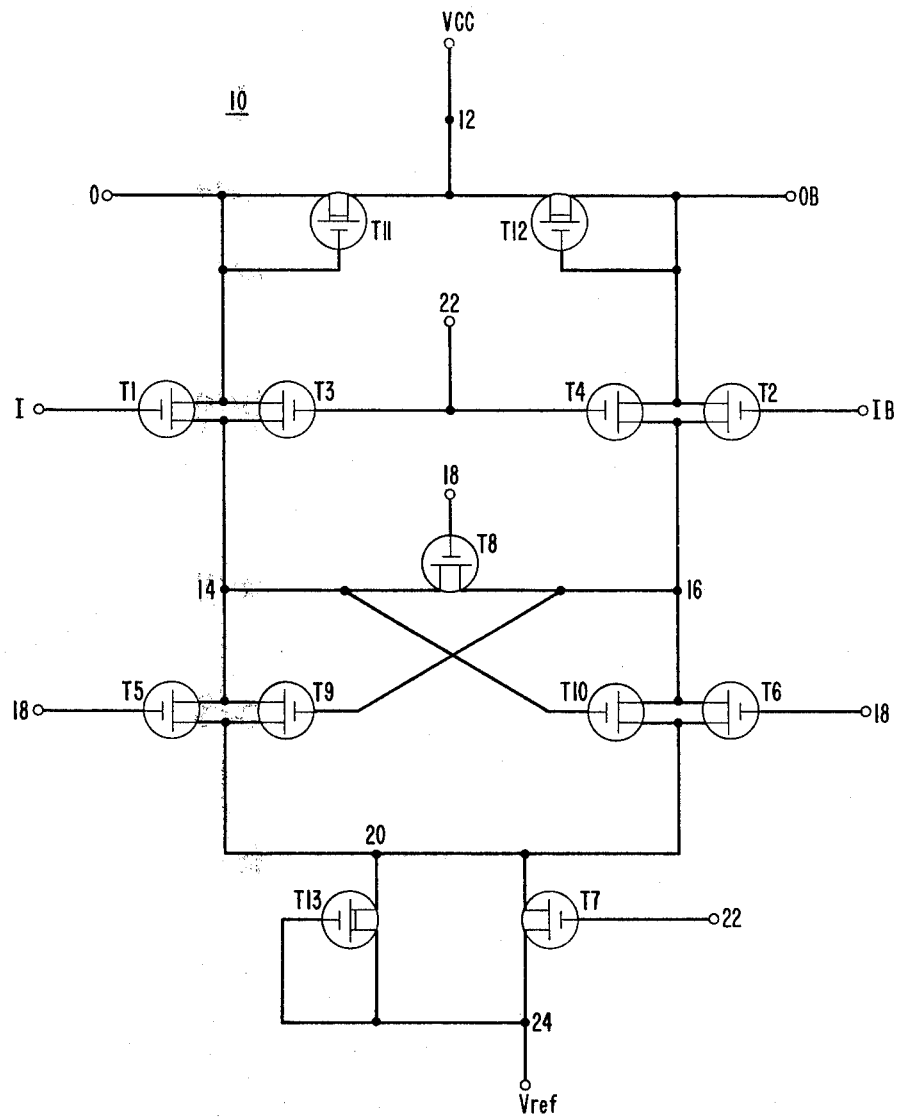

SENSE AMPLIFIER-DETECTOR CIRCUIT

TECHNICAL FIELD

This invention relates to sense amplifier (detector) circuits and, more particularly, to insulated gate field effect transistor (IGFET) sense amplifier-detector circuits which have relatively high sensitivity and are useful with random access IGFET memory circuits.

BACKGROUND OF THE INVENTION

U.S. Pat. No. 4,123,799 discloses a latching type IGFET sense amplifier which uses a pair of depletion mode IGFETs to isolate semiconductor memory bit line (input) capacitance from the internal terminals of a cross-coupled pair of IGFETs. One problem with this circuit is that the sensitivity thereof is somewhat limited and, accordingly, its use with today's high density and high speed random access memories is marginal. Another problem with this circuit is that the output terminals and the internal terminals of the cross-coupled pair are common. This limits response time and sensitivity.

It would be desirable to have a relatively high sensitivity latching type of sense amplifier (detector) in which the internal terminals of a cross-coupled pair of the amplifier are isolated from the capacitive loading of the input and output terminals.

SUMMARY OF THE INVENTION

The present invention is a sense amplifier circuit which essentially comprises first and second load elements, first, second, third, and fourth enhancement mode field effect transistors, resistive circuit means, cross-coupled circuit means, latching circuit means, and voltage equalization circuit means. The gates of the first and second transistors serve as circuit input terminals and the output circuitry of each transistor, which is coupled to one of the load elements, serves as a separate circuit output terminal. The cross-coupled circuit means is coupled to the output circuitry of the four transistors, the voltage equalization circuit means, and to the latching circuit means.

In a preferred embodiment, fifth and sixth enhancement mode field effect transistors are used which have the gate terminals thereof coupled together and coupled to the voltage equalization circuit means, and have the output circuitry thereof coupled to the cross-coupled circuit means. In this preferred embodiment, the latching circuit means comprises a seventh enhancement mode field effect transistor, the voltage equalization means comprises an eighth similar transistor, the load elements and the resistive circuit means each comprises a separate depletion mode field effect transistor with the gate coupled to the output circuitry, and the cross-coupled circuit means is a pair of enhancement mode field effect transistors.

The sense amplifier circuit of the present invention isolates the cross-coupled circuit means from input load capacitance at the input terminals and from output load capacitance at the output terminals. This allows the cross-coupled pair to be latched relatively quickly and essentially independent of input and output capacitive loading and thus improves sensitivity and response time of the sense amplifier. In addition, the use of enhancement mode input transistors and depletion mode transistor load elements provides relatively high detection sensitivity and output signal levels which do not suffer from the threshold voltage loss of enhancement mode transistors.

These and other features and advantages of the invention will be better understood from consideration of the following detailed description in conjunction with the accompanying drawing.

BRIEF DESCRIPTION OF THE DRAWING

The FIGURE illustrates a sense amplifier-detector in accordance with the present invention.

DETAILED DESCRIPTION

Referring now to the Figure, there is illustrated a sense amplifier-detector circuit 10 which comprises input transistors T1 and T2, cross-coupled circuitry comprising transistors T9 and T10, voltage equalization circuitry comprising transistor T8, voltage level setting transistors T5 and T6, a resistive circuit means comprising transistor T13, a latching circuit means comprising transistor T7, output level hold circuitry comprising transistors T3 and T4, and load elements comprising transistors T11 and T12. Circuit 10 senses complementary input signals applied to input terminals I and IB (the gate terminals of T1 and T2, respectively) and produces output complementary signals at output terminals O and OB (the drains of T1 and T2, respectively). An input "1" signal applied to terminal I and an input "0" signal applied to terminal IB results in a "1" output signal appearing at terminal 0 and a "0" output signal appearing at terminal OB. Conversely, an input "0" signal applied to terminal I and an input "1" applied to terminal IB results in a "0" output signal at terminal O and a "1" output signal at terminal OB.

In a preferred embodiment, transistors T1, T2, T3, T4, T5, T6, T7, T8, T9, and T10 are all enhancement mode isulated gate field effect transistors, and load devices T11 and T12 and the resistive element T13 each comprises a separate depletion mode insulated gate field effect transistor with the gate of each coupled to the respective source.

The drains of T11 and T12 are coupled together to terminal 12 and to a power supply VCC. The gate and source of T11 are coupled to the drains of T1 and T3 and to output terminal 0. The gate and source of T12 are coupled to the drains of T2 and T4 and to output terminal OB. The sources of T1 and T3 are coupled to the drains of T5 and T9, the source of T8, the gate of T10, and to a terminal 14. The sources of T2 and T4 are coupled to the drains of T6, T8, and T10, the gate of T9, and to a terminal 16. The sources of T5, T6, T9, and T10 and the drains of T7 and T13 are all coupled to a terminal 20. The gate and source of T13 are coupled to the source of T7 and to a terminal 24 which is coupled to a power supply Vref. The gates of T5, T6, and T8 are coupled together to a common terminal 18. The gates of T3, T4, and T7 are coupled together to a common terminal 22.

The drain and source of each of the transistors may be referred to as the output circuitry of that transistor. A circuit element, device, or a circuit terminal which is denoted as being coupled to the output circuitry of a transistor may be coupled to the drain or the source of the transistor.

At the beginning of a cycle of operation of sense amplifier-detector circuit 10, input terminals I and IB are both held at equal potentials of approximately VCC, terminal 22 is held at the potential of Vref, and terminal 18 is held at the potential of approximately VCC. These conditions result in conduction from VCC through T11, T1, the parallel combination of T5 and T9, T13, and to terminal 24 and to Vref, and from VCC through T12, T2, the parallel combination of T6 and T10, T13, and to terminal 24 and to Vref. Thus at this time there are two direct-current paths between VCC and Vref. The impedance levels of all transistors utilized are selected such that terminals 0 and OB are at approximately equal potentials and said potentials are close to that of VCC. In addition, terminals 14 and 16 are at essentially equal potential levels at a value intermediate between that of VCC and Vref.

An input signal and the complement thereof are now applied to terminals I and IB, respectively. Assume that a "0" input signal having a Vref potential level is applied to input terminal I and a "1" input signal having a VCC potential level is applied to terminal IB. Terminal 18 is now pulsed from VCC to Vref and terminal I, which had been held at VCC, is now allowed to drop in potential towards Vref in response to the "0" input signal. This turns off T5, T6, and T8. Thereafter, terminal 22 is pulsed from Vref to VCC. This turns on T3, T4, and T7. In response to T7 turning on, terminal 20 drops in potential towards Vref. This causes terminals 14 and 16 to likewise initially drop in potential. The conductance of T2 is greater than that of T1 because the potential level at the gate thereof is greater than at the gate of T1. This results in terminal 14 dropping in potential at a faster rate than terminal 16. Thus a potential difference between terminals 14 and 16 is created.

The potential difference between terminals 14 and 16 is amplified by cross-coupled transistors T9 and T10. As a result of this potential difference, T9 conducts heavily and thus pulls terminal 14 close to Vref. This turns off T10. Output terminal 0 follows terminal 14 and also reaches a potential level close to Vref. This represents an output "0" signal on output terminal 0. T1 turns off as the input signal applied to terminal I approaches Vref. Output terminal 0 still stays at a value close to Vref since T3, T11, and T9 are on at this time.

T10 is turned off as terminal 14 goes towards Vref and, accordingly, terminal 16 and output terminal OB both rise in potential towards VCC because there is no longer a current path to Vref since T6 and T10 are off. This represents an output "1" signal on output terminal OB.

Thus, it is clear that with "0" and "1" signals applied to input terminals I and IB, respectively, that output "0" and "1" signals result at terminals 0 and OB, respectively. Input terminals I and IB and terminal 18 are now returned to VCC and terminal 22 is returned to Vref. A new cycle of operation of circuit 10 can now begin. If a "1" and a "0" are applied to input terminals I and IB, respectively, then the resulting output signals at terminals O and OB are a "1" and a "0", respectively.

It is to be noted that after the input signals are applied and cross-coupled transistors T9 and T10 have been latched (T7 is turned on), that the output signals appearing at terminals O and OB will not change even if the input signals at terminals I and IB change.

T5 and T6 serve to help equalize the potentials of terminals 14 and 16 and speed up the recovery of circuit 10 to the initial conditions. In some applications T5 and T6 can be elminated.

Sense amplifier circuit 10 has been built as part of a 256 by 8 bit static random access memory that is formed on a single integrated silicon chip that has been tested and found to be functional. All the transistors used are n-channel insulated gate field effect transistors. T1–T10 are enhancement-type transistors and T11, T12, and T13 are depletion mode transistors. The power supply potentials used were VCC= +5 volts and Vref=0 volts. The threshold voltage (Vth), width, and length of each transistor used are given in the table below.

| Transistor | Threshold Voltage Vth (Volts) | Width (Microns) | Length (Microns) |
|---|---|---|---|
| T1 | 0.5 | 30 | 2.5 |
| T2 | 0.5 | 30 | 2.5 |
| T3 | 0.5 | 50 | 2.5 |
| T4 | 0.5 | 50 | 2.5 |
| T5 | 1.0 | 5 | 2.5 |
| T6 | 1.0 | 5 | 2.5 |
| T7 | 1.0 | 170 | 2.5 |
| T8 | 0.5 | 10 | 2.5 |
| T9 | 1.0 | 60 | 2.5 |
| T10 | 1.0 | 60 | 2.5 |
| T11 | −2.5 | 10 | 2.5 |
| T12 | −2.5 | 10 | 2.5 |
| T13 | −2.5 | 5 | 10 |

In this embodiment T11, T12, and T13 act essentially as resistors. The sense amplifier was designed to allow detection of a voltage difference on the I and IB terminals as small as approximately 0.1 volts. Thus it is not necessary to wait until the I or IB terminal reaches the Vref potential level to start sensing the input signals. This allows for relatively high speed operation.

It is to be understood that the embodiments described herein are merely illustrative of the principles of the invention. Various modifications are possible within the scope of the invention. For example, depletion mode transistors T11, T12, and T13 can be replaced by standard integrated circuit transistors on a variety of other resistive type elements. Still further, transistors T1, T2, T3, T4, T5, T6, T7, T8, T9, and T10 could be junction field effect transistors. Still further, the transistors could be p-channel field effect transistors providing the power supply polarities were appropriately modified.

We claim:

1. A circuit comprising:
   first and second load elements;
   first, second, third, and fourth enhancement mode field effect transistors, the gate terminals of the first and second transistors being adapted to serve as circuit input terminals, and the gate terminals of the third and fourth transistors being coupled together;
   resistive circuit means;
   cross-coupled circuit means;
   latching circuit means;
   the cross-coupled circuit means being coupled to the output circuitry of the four transistors, to the latching circuit means, and to the resistive circuit means; and
   voltage equalization circuit means coupled to the cross-coupled circuit means.

2. The circuit of claim 1 further comprising:
   fifth and sixth enhancement mode field effect transistors, the gate terminals thereof being coupled together and being coupled to the voltage equalization circuit means, and the output circuitry of the fifth and sixth transistors being coupled to the cross-coupled circuit means.

3. The circuit of claim 2 wherein the latching circuit means comprises a seventh enhancement mode field effect transistor whose output circuitry is coupled to the cross-coupled circuit means.

4. The circuit of claim 3 wherein the voltage equalization circuit means comprises an eighth enhancement mode field effect transistor with the gate thereof coupled to the gates of the fifth and sixth transistors.

5. The circuit of claim 4 wherein the load elements and the resistive element each comprises a separate depletion mode field effect transistor with the gate thereof coupled to the output circuitry thereof.

6. The circuit of claim 5 wherein all the transistors are n-channel insulated gate field effect transistors.

* * * * *